(12) United States Patent
Freund et al.

(10) Patent No.: US 9,779,931 B2
(45) Date of Patent: Oct. 3, 2017

(54) METHOD OF MANUFACTURING SEMICONDUCTOR WAFERS AND METHOD OF MANUFACTURING A SEMICONDUCTOR DEVICE

(71) Applicant: Infineon Technologies AG, Neubiberg (DE)

(72) Inventors: Johannes Freund, Deisenhofen (DE); Helmut Oefner, Zorneding (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/878,362

(22) Filed: Oct. 8, 2015

(65) Prior Publication Data

US 2017/0103882 A1    Apr. 13, 2017

(51) Int. Cl.
| | | |
|---|---|---|
| *H01L 21/00* | (2006.01) | |
| *H01L 21/02* | (2006.01) | |
| *H01L 21/265* | (2006.01) | |
| *H01L 21/66* | (2006.01) | |
| *H01L 23/544* | (2006.01) | |
| *H01L 21/263* | (2006.01) | |
| *H01L 21/324* | (2006.01) | |

(52) U.S. Cl.
CPC ...... *H01L 21/02008* (2013.01); *H01L 21/263* (2013.01); *H01L 21/26533* (2013.01); *H01L 21/324* (2013.01); *H01L 22/12* (2013.01); *H01L 23/544* (2013.01); *H01L 2223/54413* (2013.01); *H01L 2223/54426* (2013.01); *H01L 2223/54433* (2013.01); *H01L 2223/54493* (2013.01)

(58) Field of Classification Search
CPC .............. H01L 23/52; H01L 21/02008; H01L 21/26533; H01L 22/12; H01L 23/544
See application file for complete search history.

(56) References Cited

U.S. PATENT DOCUMENTS

| | | | | |
|---|---|---|---|---|
| 7,745,238 B2* | 6/2010 | Ramappa | ................. | H01L 22/10 257/E21.521 |
| 8,389,099 B1* | 3/2013 | Matthews | ............. | H01L 23/544 148/33.2 |
| 2015/0050754 A1* | 2/2015 | Ploss | ................. | H01L 21/26513 438/10 |

* cited by examiner

*Primary Examiner* — Richard Booth
(74) *Attorney, Agent, or Firm* — Murphy, Bilak & Homiller, PLLC (57) ABSTRACT

An embodiment of a method of manufacturing semiconductor wafers comprises determining at least one material characteristic for at least two positions of a semiconductor ingot. A notch or a flat is formed in a semiconductor ingot extending along an axial direction. A plurality of markings is formed in the semiconductor ingot. At least some of the plurality of markings at different positions along the axial direction are distinguishable from each other by a characteristic feature set depending on the at least one material characteristic. The semiconductor ingot is then sliced into semiconductor wafers.

23 Claims, 8 Drawing Sheets

METHOD OF MANUFACTURING SEMICONDUCTOR WAFERS AND METHOD OF MANUFACTURING A SEMICONDUCTOR DEVICE

BACKGROUND

Semiconductor doping processes are essential in front-end-of-line (FEOL) processing for manufacturing semiconductor zones of different conductivity type, for example p-doped and n-doped semiconductor zones. Precise and cost-effective doping of a semiconductor body, for example a background doping of a semiconductor wafer is desirable for meeting demands on specified device characteristics, for example demands on breakdown voltage, breakdown strength or softness. Meeting these demands becomes even more challenging when moving to greater ingot lengths and greater wafer diameters.

SUMMARY

The present disclosure relates to a method of manufacturing semiconductor wafers. The method comprises determining at least one material characteristic for at least two positions of a semiconductor ingot. The method further comprises forming a notch or a flat in the semiconductor ingot extending along an axial direction. The method further comprises forming a plurality of markings in the circumference of the semiconductor ingot. At least some of the plurality of markings at different positions along the axial direction are distinguishable from each other by a characteristic feature set depending on the at least one material characteristic. The method further comprises slicing the semiconductor ingot into semiconductor wafers.

The present disclosure also relates to a method of manufacturing a semiconductor device. The method comprises determining a material characteristic of a semiconductor wafer by analyzing a marking at a circumference of the semiconductor wafer, the marking being different from a flat. The method further comprises adjusting at least one of proton irradiation and annealing parameters based on the material characteristic. The method further comprises irradiating the semiconductor wafer with protons and thereafter, annealing the semiconductor wafer based on the at least one of the adjusted proton irradiation and annealing parameters.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having," "containing," "including," "comprising" and the like are open and the terms indicate the presence of stated structures, elements or features but not preclude the presence of additional elements or features. The articles "a," "an" and "the" are intended to include the plural as well as the singular, unless the context clearly indicates otherwise.

The Figures illustrate relative doping concentrations by indicating "−" or "+" next to the doping type "n" or "p". For example, "n−" means a doping concentration that is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer," "substrate," "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material or wide band gap semiconductors like sapphire.

The term "horizontal" as used in this specification intends to describe an orientation substantially parallel to a first or main surface of a semiconductor substrate or body. This can be for instance the surface of a wafer or a semiconductor die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside or rear surface while the first surface is considered to be formed by the upper, front or main surface of the semiconductor substrate. The terms "above" and "below" as used in this specification therefore describe a relative location of a structural feature to another.

A dicing process may be used to divide the wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g., along four orthogonal directions in the plane of the tape. By pulling the tape, the semiconductor wafer gets divided into a plurality of semiconductor dies (chips).

Figure 1:
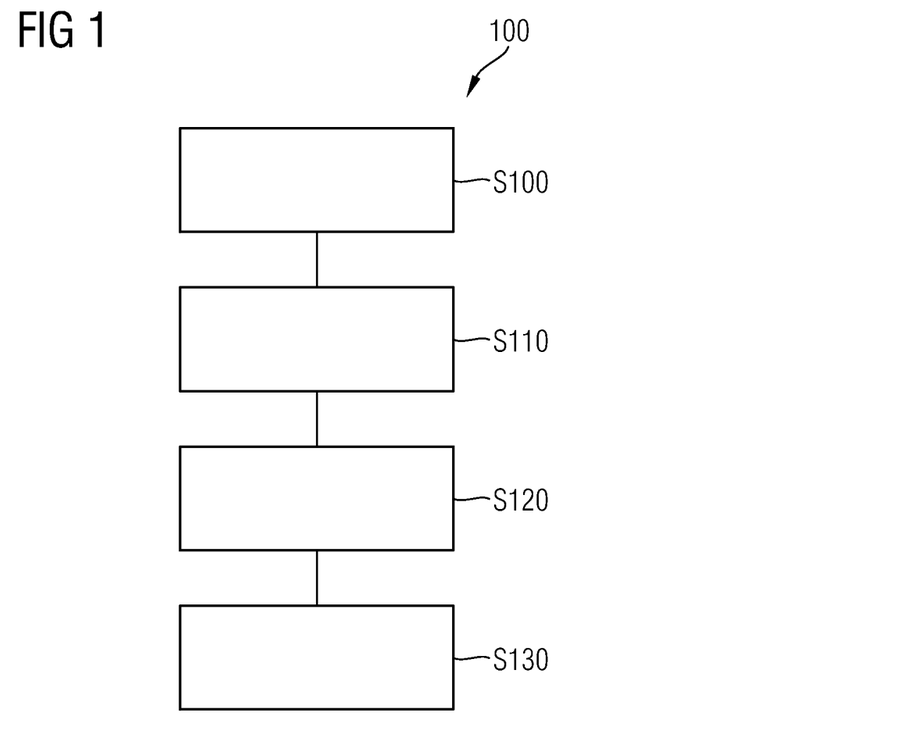
FIG. 1 is a schematic flow diagram for illustrating a method of manufacturing semiconductor wafers comprising a notch or a flat and a plurality of markings in the circumference of the semiconductor wafers, according to an embodiment.

FIG. 1 is a schematic flow diagram for illustrating a method 100 of manufacturing semiconductor wafers.

It will be appreciated that while method 100 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

Process feature S100 comprises determining at least one material characteristic for at least two positions of a semiconductor ingot. The material characteristic may be determined by one or more of electrical characterization techniques, optical characterization techniques, and physical/chemical characterization techniques. Electrical characterization techniques may be used to determine the material characteristic corresponding to or being related to resistivity, carrier concentration, mobility, carrier lifetimes, and deep level impurities, for example. Examples of electrical characterization techniques for determining the material characteristic are two-point probe analysis, four-point probe analysis, differential Hall effect, capacitance-voltage profiling, deep level transient spectroscopy (DLTS), for example. Examples of optical characterization techniques are microscopy, ellipsometry, photoluminescence, transmission spectroscopy, absorption spectroscopy, raman spectroscopy, reflectance modulation, and cathodoluminescence, for example. Infrared absorption spectroscopy may be used to determine impurity concentrations, for example oxygen impurities observed in the infrared range due to vibrational absorption. Carrier concentrations may also be determined by physical/chemical characterization, for example secondary ion mass spectroscopy (SIMS). The material characteristic may be determined at opposite end faces of the semiconductor ingot and/or at a circumference of the semiconductor ingot. The semiconductor ingot may correspond to any semiconductor block that can be divided into a plurality of wafers.

Process feature S110 comprises forming a notch or a flat in the semiconductor ingot extending along an axial direction. In some embodiments, the semiconductor ingot is a silicon ingot formed by a Czochralski (CZ) method, e.g. by the standard CZ method or by the magnetic CZ (MCZ) method or by the Continuous CZ (CCZ) method. In some other embodiments, the semiconductor ingot is a silicon ingot formed by a Float Zone (FZ) crystal growth process. The notch, which is typically used for larger wafer diameters, for example wafer diameters of 200 mm or greater or the flat, which is typically used for smaller wafer diameters, for example wafer diameters smaller than 200 mm may be formed by a machining process, for example by a grinding process using an appropriate grinding equipment, for example a grinding wheel. The notch is machined for positioning and orientation purposes. Likewise, the flat is machined for indicating type and orientation of the crystal. A so-called primary flat is located in the circumference of the wafer. The primary flat has a specific crystal orientation relative to the wafer surface. A so-called secondary flat indicates the doping concentration of the wafer. The location of this flat varies.

Process feature S120 comprises forming a plurality of markings in the circumference of the semiconductor ingot, wherein at least some of the plurality of markings at different positions along the axial direction are distinguishable from each other by a characteristic feature set depending on the at least one material characteristic. Each of the plurality of markings serves for a different purpose than the flat or notch. The plurality of markings allow for a traceability of an axial wafer position in the ingot during FEOL processes and provide further information on material characteristic(s) of the respective wafer, for example. In view of variations of characteristics along the axial direction of an ingot, for example variations of specific resistance due to segregation effects during CZ ingot growth, or variations of contaminants, for example carbon (C) or oxygen (O), traceability of the axial wafer position and material characteristic(s) derivable from the respective marking allow for a cost-effective FEOL processing, for example FEOL processing adapted to variations of characteristics along the axial direction of the ingot caused by a manufacturing process of the ingot. By way of example, ion implantation doses, for example proton irradiation doses for adjusting a background doping concentration in a wafer may be set when information on the respective material characteristic or axial position of the wafer to be processed is available from the marking without the need of determining the material characteristic on a wafer-by-wafer basis. Based on the determination of the at least one material characteristic at the at least two positions of the semiconductor ingot, the at least one material characteristic can be calculated with respect to an axial position and fixed at the respective axial position by formation of the marking set depending on the at least one material characteristic. Thereby, characterization effort in later FEOL processing can be reduced since a further measurement of the at least one material characteristic becomes superfluous.

Thereafter, process feature S130 is carried out. The process feature S130 comprises slicing the semiconductor ingot into semiconductor wafers. By way of example, after ends of the ingot are cut-off, the ingot may be cut into shorter sections in order to optimize the slicing operation that will follow later. Silicon wafers are typically sliced from the ingot using both an inner-diameter (ID) and wire type saws. After slicing, the "as-cut" wafers are cleaned, for example in a series of chemical baths to remove any residual slurry. From here, the wafers may proceed into a series of refining steps to make them stronger and flatter.

In some embodiments, the at least some of the plurality of markings at different positions along the axial direction are distinguishable from each other by an angular position relative to the notch or flat.

Figure 2:
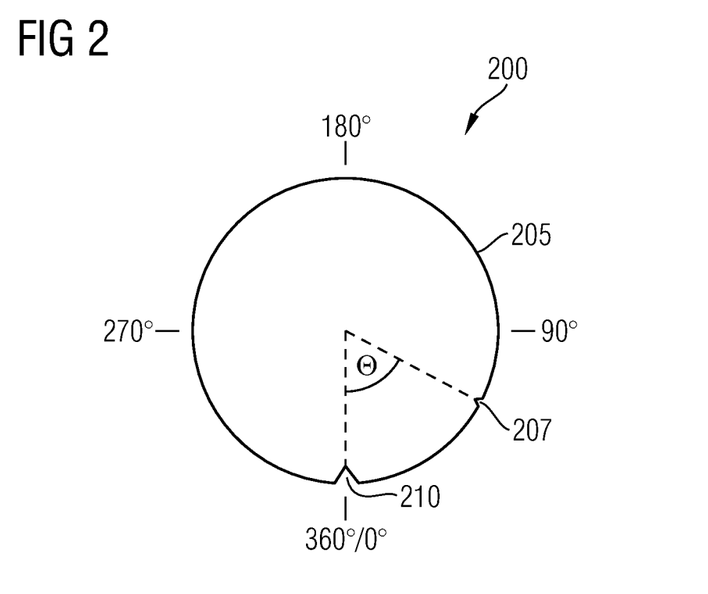
FIG. 2 is a schematic top view of a semiconductor wafer comprising a marking at an angular distance A from the notch, according to an embodiment.

In some embodiments, the plurality of markings are formed in the semiconductor ingot by rotating the semiconductor ingot between 0° and 360° around the axial direction while moving a marking position along the axial direction from a first axial position to a second axial position, thereby increasing an angular position of the markings with increasing distance from the first axial position. Rotating the semiconductor ingot between 0° and 360° may be applied in case that a front side and a back side of the semiconductor wafer can be distinguished, for example. In case the front side and the back side of the semiconductor wafer cannot be distinguished, the semiconductor ingot may be rotated between 0° and 180° around the axial direction while moving the marking position along the axial direction. Referring to the schematic top view 200 of a semiconductor wafer 205 of FIG. 2, traceability of the semiconductor wafer 205 and identification of the at least one material characteristic may be achieved by the characteristic feature of an angular position θ of a marking 207 relative to a notch 210.

Figure 3:
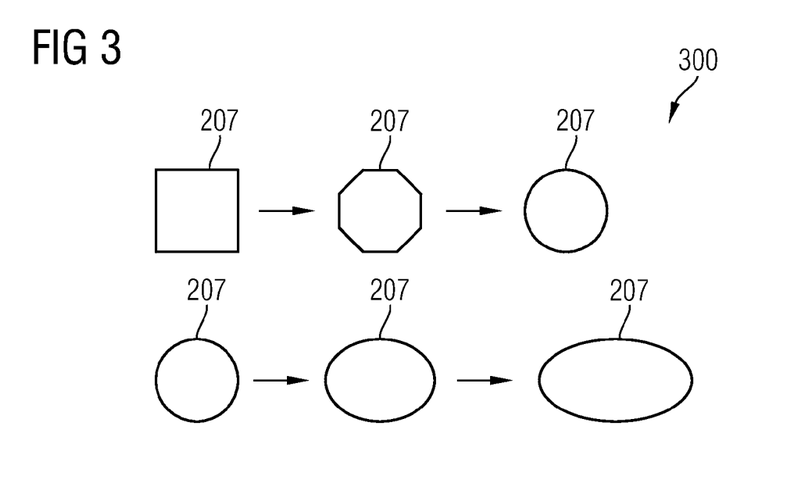
FIG. 3 depicts schematic views of markings changing in shape from a first characteristic shape to a second characteristic shape, according to an embodiment.

In some embodiments, the at least some of the plurality of markings at different positions along the axial direction are distinguishable from each other by marking shape. Information on the axial position and identification of the at least one material characteristic may be mapped via a change of geometry of the marking, for example a change between different geometries such as a change between circular and ellipsoidal geometries, a change between circular and square geometries, a change between square and rectangular geometries. An exemplary illustration of a change of geometry of the marking 205 is schematically illustrated in the view 300 of FIG. 3. The view 300 is taken toward the circumference of the semiconductor wafer 205 along a radial direction, for example.

Figure 4:
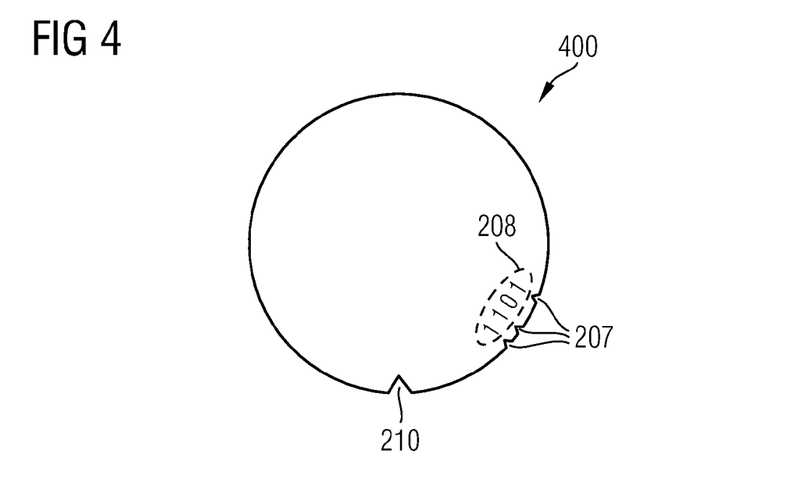
FIG. 4 is a schematic top view of a semiconductor wafer comprising a plurality of markings arranged along the circumference of the semiconductor wafer, the plurality of markings representing a digital code, according to an embodiment.
Figure 5:
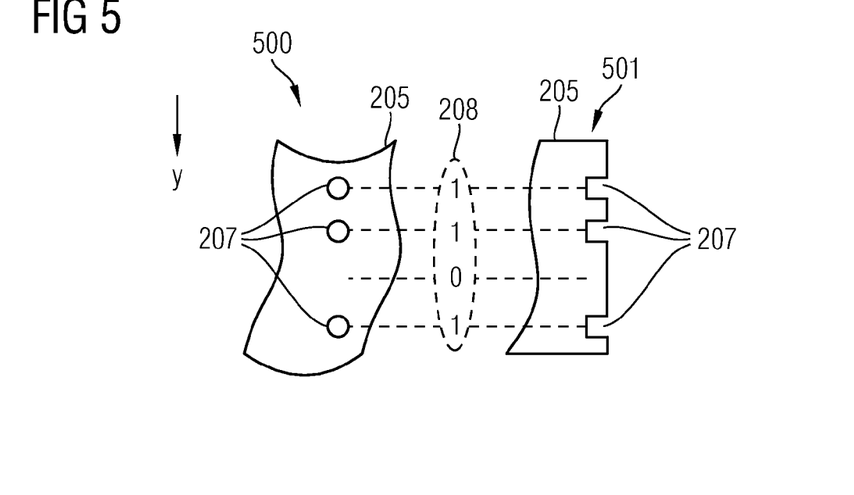
FIG. 5 is a schematic side view and a schematic sectional view of a semiconductor wafer comprising a plurality of markings arranged along an axial direction in the circumference of the semiconductor wafer, the plurality of markings representing a digital code, according to an embodiment.

In some embodiments, the characteristic feature representing the axial wafer position and the at least one material characteristic is a digital code in the circumference of the semiconductor wafer. Digital codes, for example binary numbers may be realized by the presence or absence of a marking along a sequence of possible marking positions. The markings representing the binary number may be arranged one after another along the circumference of the semiconductor wafer. An exemplary illustration of markings 207 arranged one after another along the circumference of the semiconductor wafer 205 is given in the schematic top view 400 of FIG. 4. The markings representing a binary number 208 may be arranged one after another along an axial direction y between opposite main surfaces of the semiconductor wafer 205. An exemplary illustration of markings 207 arranged one after another along the axial direction y between the opposite main surfaces of the semiconductor wafer 205 is given in the schematic side view 500 and the schematic sectional view 501 of FIG. 5. In some other embodiments, a combination of arrangement of the markings 207 illustrated in FIG. 4 and FIG. 5 may be applied.

Figure 6:
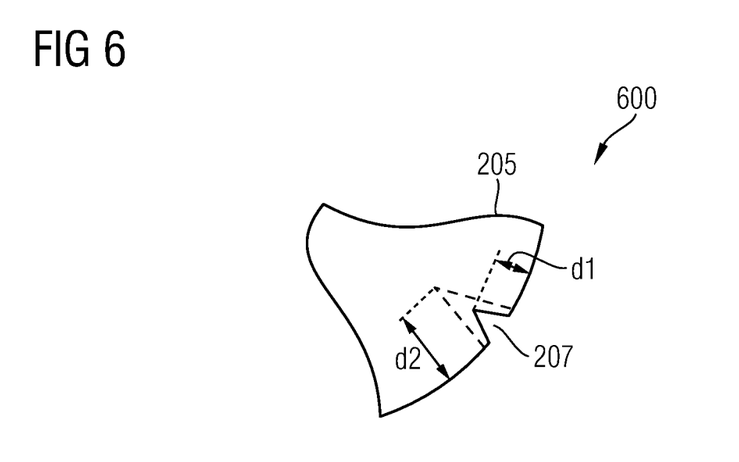
FIG. 6 is a schematic top view of a semiconductor wafer for illustrating markings having different radial extensions d1, d2 toward a center of the semiconductor wafer, according to an embodiment.

In some embodiments, the at least some of the plurality of markings at different positions along the axial direction are distinguishable from each other by a radial extension toward a center of the semiconductor wafer. An exemplary illustration of markings 207 having different radial extensions d1, d2 toward a center of the semiconductor wafer 205 is given in the schematic top view 600 of FIG. 6.

In some embodiments, the at least some of the plurality of markings at different positions along the axial direction are distinguishable from each other by an angular extension. An exemplary illustration of markings 207 having different angular extensions $\Delta\theta1$, $\Delta\theta2$ is given in the schematic top view 700 of FIG. 7, wherein $\Delta\theta1 > \Delta\theta2$.

In some embodiments, the plurality of markings is formed by at least one of laser marking and machining. One example of laser marking is laser engraving. The point where the laser touches the circumference of the semiconductor wafer may be on the focal plane of the laser's optical system. The area inside the focal point is significantly affected when the laser beam passes over the circumference of the semiconductor wafer. The energy delivered by the laser changes the surface of the semiconductor wafer under the focal point. It may heat up the surface and subsequently vaporize the semiconductor material. One example of machining is grinding, for example abrasive grinding technology by a grinding wheel such as a diamond grinding wheel. A depth of the marking may exceed a depth up to which a wafer edge rounding occurring after wafer sawing removes material along the wafer edge. The depth of the marking is typically in a range between 10 μm and 500 μm, or between 20 μm and 300 μm, or between 20 μm and 200 μm.

In some embodiments, the notch or flat and the plurality of markings are formed in the same process equipment.

In some embodiments, the marking position is moved along the axial direction by moving the semiconductor ingot relative to a marking process equipment or by moving the marking process equipment relative to the silicon ingot.

In some embodiments, at least two of the plurality of markings is formed at different angular positions with respect to at least one axial position. An example is a digital code represented by a binary number having more than two digits.

Figure 7:
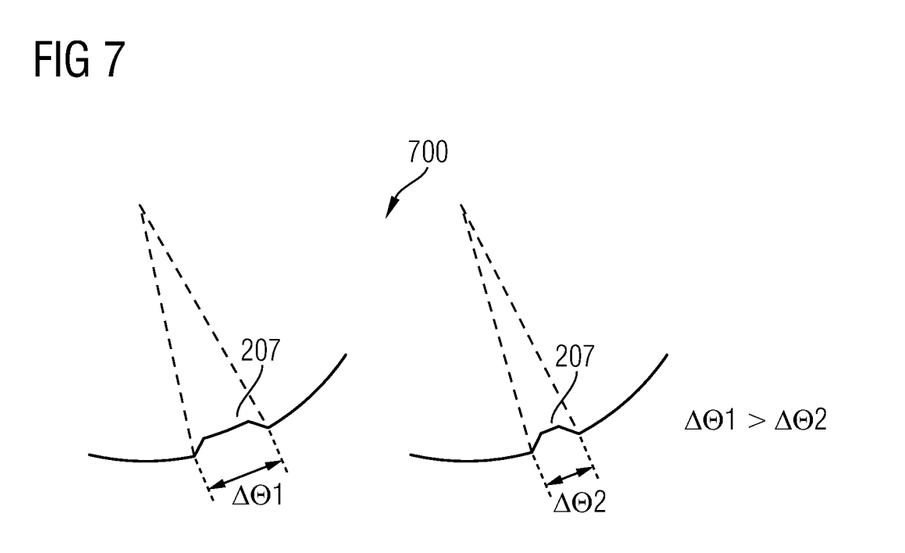
FIG. 7 is a schematic top view of a semiconductor wafer for illustrating markings having different angular extensions $\Delta\theta1$, $\Delta\theta2$, according to an embodiment.

In some embodiments, a semiconductor wafer comprises a notch or a flat. The semiconductor wafer further comprises a marking in the circumference of the semiconductor wafer, wherein an angular extension of the marking is smaller than 10°, or smaller than 5°, or even smaller than 1°. By way of example, each one of the angular extensions $\Delta\theta1$, $\Delta\theta2$ of the markings 207 is smaller than 10°. Thus, each one of the markings 207 is different from a flat typically used to indicate crystal orientation and doping of the wafer in the form of a primary flat and a secondary flat.

The embodiments described with reference to the Figures above relate to characteristic features of the markings in the circumference of the semiconductor wafer and allow for identification of the at least one material characteristic. These embodiments can be combined. In other words, different characteristic features as described above may be combined to a new characteristic feature for identification of the at least one material characteristic.

Some embodiments relate to a single crystal ingot. The single crystal ingot comprises a notch or a flat extending along an axial direction. The single crystal ingot further comprises a plurality of markings in the circumference of the single crystal ingot. At least some of the plurality of markings at different positions along the axial direction are distinguishable from each other by a characteristic feature set depending on the at least one material characteristic. In some embodiments, the single crystal ingot is a semiconductor ingot, for example a CZ silicon ingot.

Examples of the characteristic features are described with reference to FIGS. 2 to 7 may be applied to the single crystal ingot individually or in any combination.

Figure 8A:
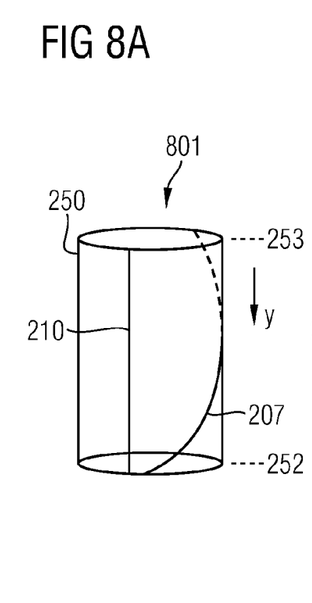
FIGS. 8A to 8E depict schematic views of single crystal ingots for illustrating embodiments of markings in addition to a notch, according to an embodiment.

Referring to the schematic view 801 of FIG. 8A, a single crystal ingot 250, for example a CZ silicon ingot includes a notch 210. The single crystal ingot 250 further includes a plurality of markings in the circumference of the single crystal ingot 250. At least some of the plurality of markings 207 at different positions along the axial direction y are distinguishable from each other by a characteristic feature. In the embodiment illustrated in FIG. 8A, the characteristic feature for distinguishing parts, for example wafers to be cut from the single crystal ingot 250 with respect to the at least one material characteristic is an angular position of the marking with respect to the angular position of the notch 210. The angular distance between the markings 207 and the notch 210 increases with increasing distance from a first end 252 of the single crystal ingot 250 toward a second end 253 of the single crystal ingot 250. The markings 207 may be formed by rotating the single crystal ingot around the axial direction while moving a marking position along the axial direction from the first end 252 to the second end 253, thereby increasing an angular distance between the markings 207 and the notch 210. In the embodiment illustrated in FIG. 8A, the angular distance ranges between 0° and 180° being suitable for semiconductor wafers that cannot be distinguished between their front and back side. In case that the semiconductor wafer can be distinguished between the front side and the back side, the axial distance may range between 0° and 360°, for example.

Figure 8B:
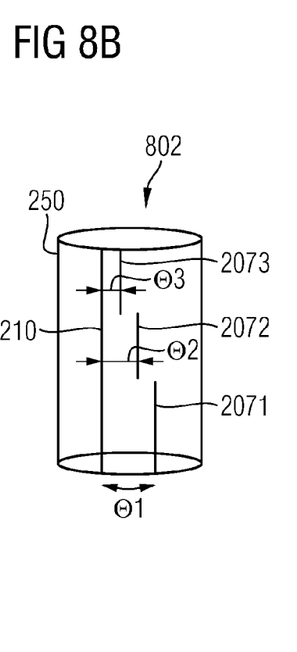

Referring to the schematic view 802 of FIG. 8B, the single crystal ingot 250, for example a CZ silicon ingot includes a notch 210 includes groups of markings 2071, 2072, 2073. The markings of the groups differ from each other by the angular distance from the notch 210. An extension of each group along the axial direction y may be greater than a thickness of a wafer to be cut from the single crystal ingot 250. Thus, each of the groups may correspond to a section of the single crystal ingot 250 where a plurality of wafers are to be cut. In this case, some of the wafers may have markings that cannot be distinguished from each other. Marking groups of wafers to be cut from the single crystal ingot 250 may be desired in case that variations of the at least one material characteristic along the axial direction of the single crystal ingot are acceptable with respect to the semiconductor wafers belonging to one group, for example. Alternatively, an extension of each group along the axial direction y may be smaller than a thickness of a wafer to be cut from the single crystal ingot 250, for example smaller than 70%, or smaller than 50%, or even smaller than 30%.

Figure 8C:
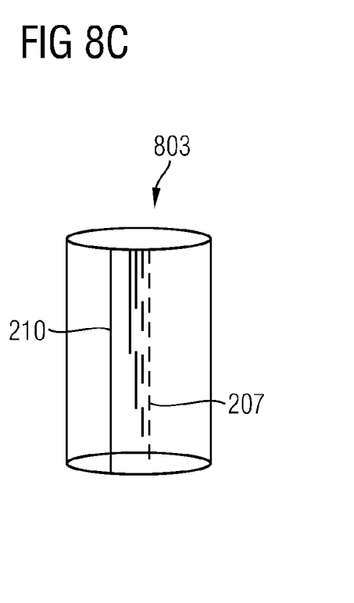

Referring to the schematic view 803 of FIG. 8C illustrating the single crystal ingot 250, at least two of the plurality of markings 207 are formed at different angular positions with respect to a same axial position along the axial direction y. Forming a plurality of markings 207 at a same axial position, i.e. with respect to one single wafer to be cut from the single crystal ingot 250, allows for stamping a wafer with a digital code such as a binary number. Examples of semiconductor wafers cut from the semiconductor ingot illustrated in FIG. 8C are described with reference to FIGS. 4 and 5.

Figure 8D:
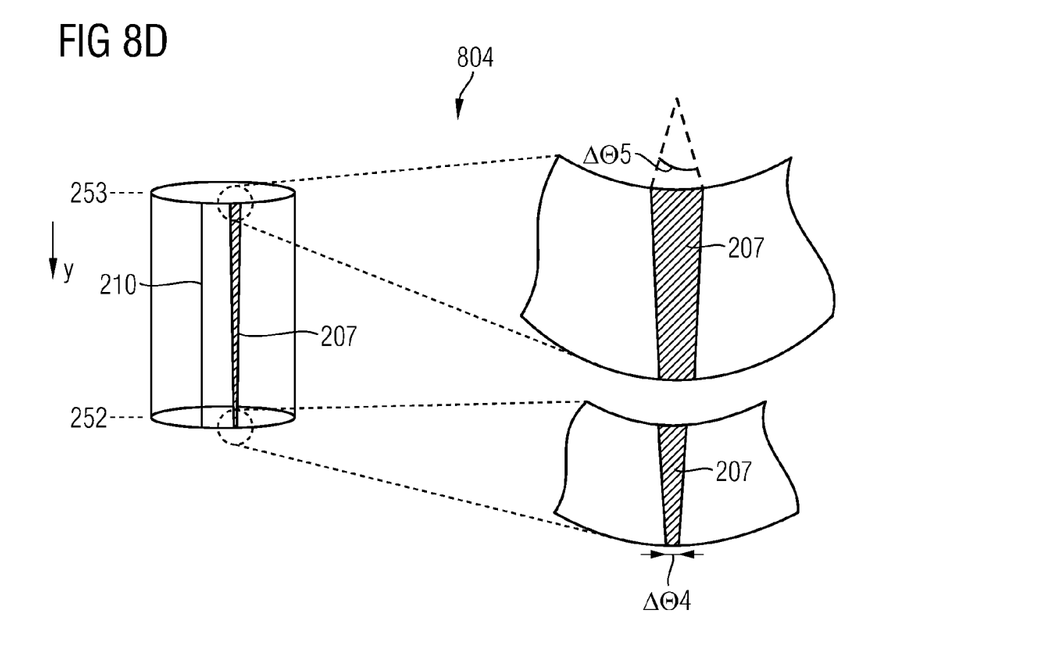

Referring to the schematic view 804 of FIG. 8D illustrating the single crystal ingot 250, the markings 207 extend at a same angular distance from the notch 210 from the first end 252 to the second end 253 of the single crystal ingot 250. An angular dimension of the markings 207 increases from a value $\Delta\theta 4$ at the first end 252 to a value $\Delta\theta 5$ at the second end 253. The angular dimension $\Delta\theta$ represents the characteristic feature configured to identify a wafer cut from the single crystal ingot 250 with respect to its axial position before slicing.

Figure 8E:
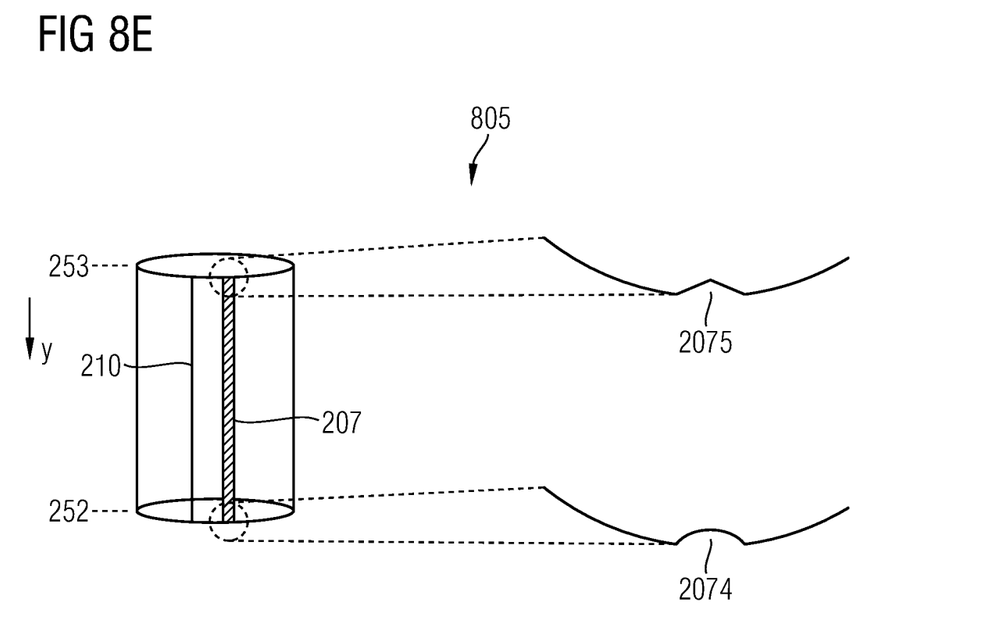

Referring to the schematic view 805 of FIG. 8E illustrating the single crystal ingot 250, the markings 207 extend at a same angular distance from the notch 210 from the first end 252 to the second end 253 of the single crystal ingot 250. A shape of the markings 207 changes from a first shape at the first end 252, for example a semicircular shaped marking 2074 to a second shape at the second end 253, for example a V-groove marking 2075. In the embodiment illustrated in FIG. 8E, the shape of the markings represents the characteristic feature configured to identify a wafer cut from the single crystal ingot 250 with respect to its axial position before slicing. Apart from V-groove and semicircular shaped markings, any other shape may be applied.

Figure 9:
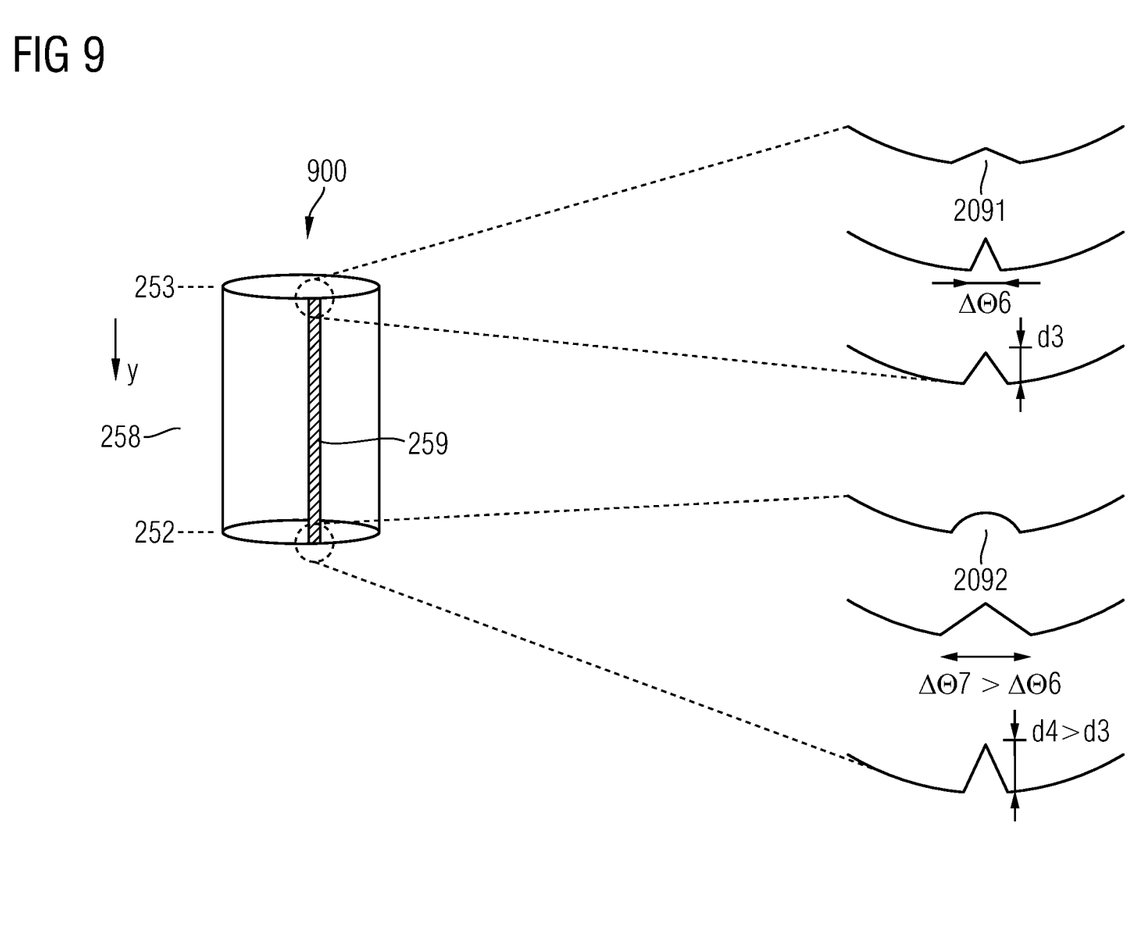
FIG. 9 is a schematic view of a single crystal ingot for illustrating a notch indicative of crystal orientation and axial position, according to an embodiment.

Referring to the schematic view 900 of FIG. 9 illustrating an example of a single crystal ingot 258, the single crystal ingot 258 comprises a notch 259 located in a circumference of the single crystal ingot 258 extending along an axial direction y at a constant angular position. The notch 259 at a first axial position is distinguishable from the notch 259 at a second axial position by a characteristic feature. This allows for identification of a material characteristic of the respective wafer or for a traceability of an axial position of a wafer cut from the single crystal ingot 258, for example. Thus, a single notch may be indicative for crystal orientation and further material characteristics or axial ingot position of wafers cut from the ingot.

In some embodiments, the characteristic feature is a shape or geometry of the notch 259. By changing a geometry from a first geometry, for example a V-groove (see notch geometry 2591) to a second geometry, for example a semicircular groove (see notch geometry 2592), the notch of a wafer cut from the single crystal ingot 258 may be indicative of crystal orientation and an axial position in the single crystal ingot 258 before dicing.

In some other embodiments, the characteristic feature is an angular extension of the notch 259. By changing an angular extension along the axial direction y of the notch 259, for example between angular extensions $\Delta\theta 6$, $\Delta\theta 7$, the notch of a wafer cut from the single crystal ingot 258 may be indicative of crystal orientation and an axial position in the single crystal ingot 258 before dicing.

In some other embodiments, the characteristic feature is a radial extension of the notch 259. By changing the radial extension along the axial direction y of the notch 259, for example between radial extensions d3 and d4, the notch of a wafer cut from the single crystal ingot 258 may be indicative of crystal orientation and an axial position in the single crystal ingot 258 before dicing.

An embodiment of a method of manufacturing a semiconductor device is described below.

The method comprises determining a material characteristic of a semiconductor wafer by analyzing a marking at a circumference of the semiconductor wafer, the marking being different from a flat. The marking may be any marking as described above with reference to FIGS. 1 to 8E.

The method further comprises adjusting at least one of proton irradiation and annealing parameters based on the determined material characteristic. The proton irradiation and annealing parameters may be adjusted in consideration of a difference between a target value of the material characteristic, for example resistivity and the determined material characteristic. The target value may correspond to a background doping of the semiconductor wafer constituting a base or drift zone of a semiconductor device to be manufactured, for example.

Figure 10A:
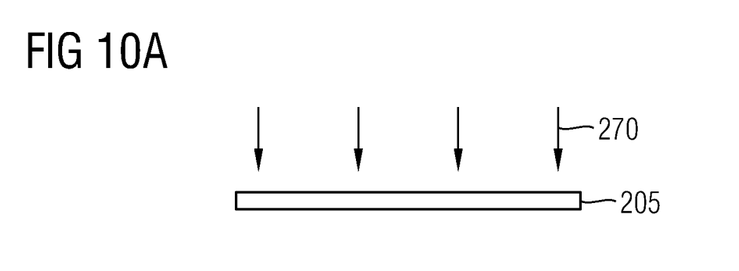
FIGS. 10A and 10B are schematic views for illustrating process features of a method of manufacturing a semiconductor device.

Referring to the schematic view illustrated in FIG. 10A, the method further comprises irradiating the semiconductor wafer 205 with protons. Proton irradiation is indicated by arrows 270. Proton irradiation may be carried out from one or both surfaces of the semiconductor wafer 205, i.e. from a front and/or a back surface of the semiconductor wafer 205. In some embodiments, an implantation dose in a range of $1 \times 10^{13}$ cm$^{-2}$ to $4 \times 10^{14}$ cm$^{-2}$ will be used. In some embodiments an implantation energy is in a range of 200 keV to 6 MeV. Proton irradiation in combination with the annealing process aims at a well-defined generation of donors in the drift zone or in the field stop zone of power devices. For front side irradiation the implantation energy is e.g. in a range between 1.5 and 5.5 MeV, whereby e.g. an n-type drift zone doping of an IGBT or a diode may be realized. When applying backside doping, the implantation energy is e.g. in a range between 200 keV and 2 MeV, whereby e.g. a field stop zone may be realized.

Figure 10B:
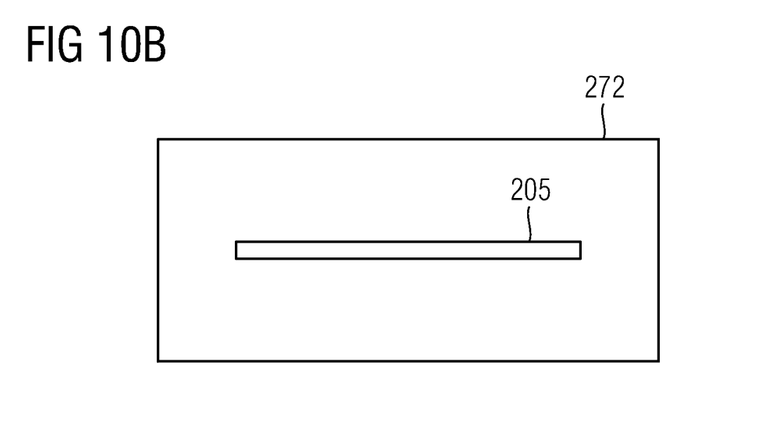

Thereafter, and referring to the schematic view illustrated in FIG. 10B, the method further comprises annealing the semiconductor wafer 205 based on the at least one of the adjusted proton irradiation and annealing parameters. According to an embodiment, annealing is carried out under inert atmosphere or air in an annealing equipment 272 such as a chamber or an oven. In some embodiments, the annealing parameters comprise a temperature range of 350° C. to 550° C., or a temperature range of 470° C. to 530° C. In some embodiments, annealing is carried out for a duration between 30 minutes and 10 hours, or between 3 hours and 20 hours.

In some embodiments, the method further comprises forming semiconductor device elements in the semiconductor wafer. The device elements may include semiconducting regions, for example p- and/or n-doped regions doped regions, insulating layers, for example gate and/or field dielectric(s) and/or inter-level dielectric(s) and conducting layers such as metal layer(s) for contacts and/or wirings. The semiconductor regions, for example a doped drain region, a doped source region, a doped body region, a doped anode region, a doped cathode region may be formed at the first surface by ion implantation and/or diffusion from a diffusion source, for example. A planar gate structure including a gate dielectric and a gate electrode or a gate structure including a gate dielectric and a gate electrode in a trench may be formed by thermal oxidation and/or layer deposition of the gate dielectric and layer deposition of a highly doped semiconductor, for example polycrystalline silicon and/or metal layer(s).

Figure 11A:
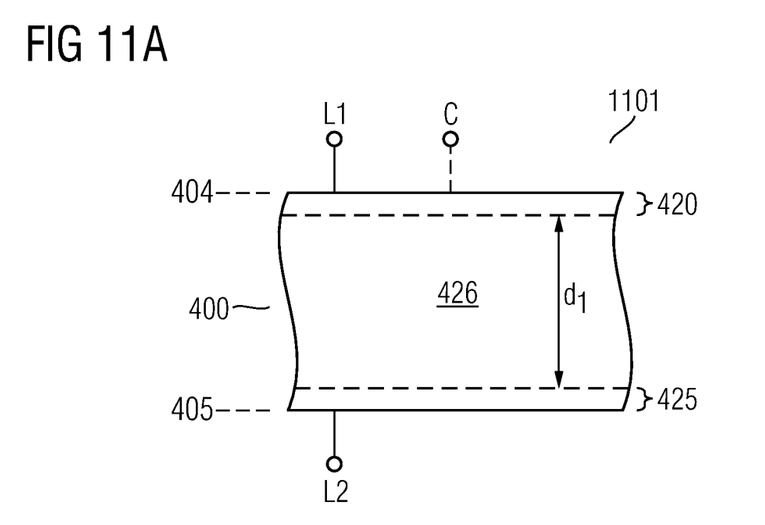
FIGS. 11A to 11C are cross-sectional views of a semiconductor body for illustrating semiconductor devices formed by including the processes illustrated in FIGS. 10A and 10B.

In some embodiments, the method results in a vertical semiconductor device as illustrated in the schematic cross-sectional view 1101 of FIG. 11A. The vertical semiconductor device comprises a semiconductor body 401 cut from the semiconductor wafer 205. The vertical semiconductor device includes a first load terminal structure 420 at a first surface 404, e.g. front surface of the semiconductor body 401. The first load terminal structure 420 includes doped semiconductor region(s). The doped semiconductor region(s) may be formed by doping processes of the semiconductor body 401 at the first surface 404, e.g. by diffusion and/or ion implantation processes. The doped semiconductor region(s) in the semiconductor body 401 of the first load terminal structure 420 may include doped source and body regions of a vertical power IGFET, for example a superjunction FET or of a collector of an IGBT, or of an anode or cathode region of a vertical power semiconductor diode or thyristor, for example. In the course of processing the semiconductor body 401 at the first surface 404, depending on the power semiconductor device to be formed in the semiconductor body, a control terminal structure such as a planar gate structure and/or a trench gate structure including gate dielectric(s) and gate electrode(s) may be formed. These processes may be carried out after the processes described with reference to FIGS. 10A and 10B.

The vertical semiconductor device further includes a second load terminal structure 425 at a second surface 405, e.g. a rear surface of the semiconductor body 401 opposite to the first surface 404. The second load terminal structure 425 includes doped semiconductor region(s). The doped semiconductor region(s) may be formed by doping processes of the semiconductor body 401 at the second surface 405, e.g. by diffusion and/or ion implantation processes. The doped semiconductor region(s) in the semiconductor body 401 of the second load terminal structure 425 may include doped field stop region(s), doped drain regions of a vertical power FET, or an emitter of an IGBT, or an anode or cathode region of a vertical power semiconductor diode, for example.

A first electrical load terminal contact L1 to the first load terminal structure 420 and an electrical control terminal contact C to a control terminal structure, if present in the vertical power semiconductor device, are part(s) of a wiring area above the first surface 404. A second electrical load contact L2 to the second load terminal structure 425 is provided at the second surface 405. The electrical load contacts L1, L2 and the electrical control terminal contact C may be formed of one or a plurality of patterned conductive layers such as metallization layers electrically isolated by interlevel dielectric layer(s) sandwiched between. Contact openings in the interlevel dielectric layer(s) may be filled with conductive material(s) to provide electrical contact between the one or the plurality of patterned conductive layers and/or active area(s) in the semiconductor body such as the first load terminal structure 420, for example. The patterned conductive layer(s) and interlevel dielectric layer(s) may form the wiring area above the semiconductor body 401 at the first surface 404, for example. A conductive layer, e.g. a metallization layer or metallization layer stack may be provided at the second surface 405, for example.

In the vertical semiconductor device illustrated in FIG. 11A, a current flow direction is between the first and second load terminal contacts L1, L2 along a vertical direction between the opposite first and second surfaces 404, 405.

In the embodiment illustrated in FIG. 11A, a blocking voltage capability of the vertical semiconductor device can be adjusted by an appropriate distance d1 of a drift or base zone 426 between the first and second load terminal structures 420, 425, for example between a body region and a drain contact region or a field stop zone of a FET.

Figure 11B:
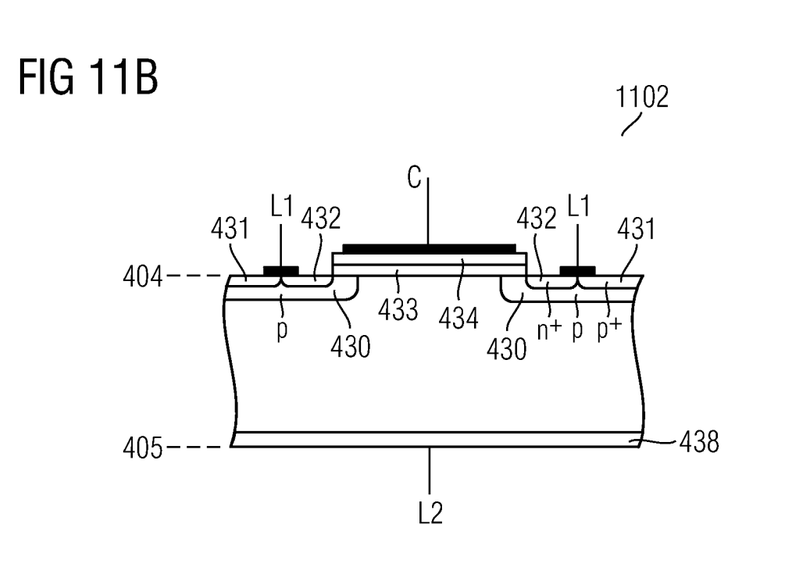

In the schematic cross-sectional view 1102 of FIG. 11B, the semiconductor device manufactured based on the processes illustrated in FIGS. 10A and 10B is a planar gate transistor comprising a p-doped body region 430, a $p^+$-doped body contact region 431 and an $n^+$-doped source region 432. A gate dielectric 433 electrically isolates a gate electrode 434 from the drift or base zone 426. The gate electrode 434 is electrically connected to the control terminal contact C. In some embodiments, the gate electrode 434 corresponds to the control terminal contact C. The first load terminal contact L1, for example an emitter terminal contact is electrically connected to the p-doped body region 430 and to the $n^+$-doped source region 432. A highly doped region 438, for example a p+-doped bipolar injection region of an IGBT or an $n^+$-doped drain contact region of an IGFET at the second surface 405 is electrically connected to the second load terminal contact L2, for example a collector terminal contact of an IGBT.

Figure 11C:
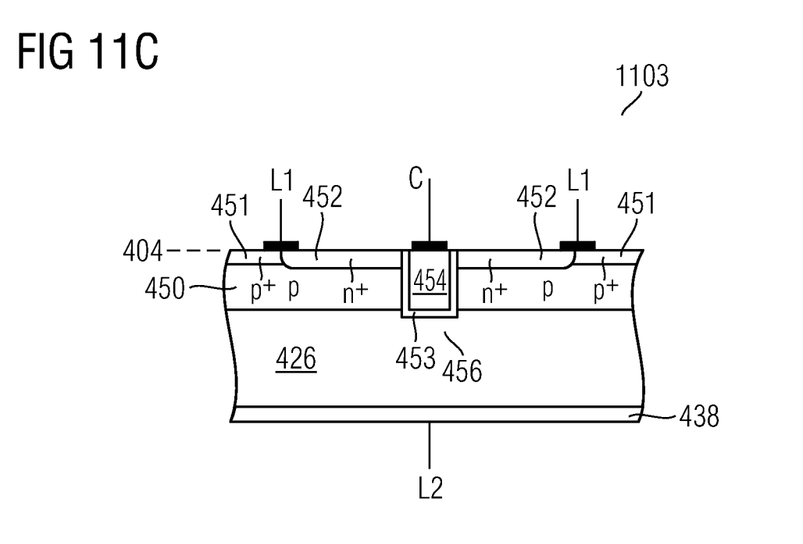

In the schematic cross-sectional view 1103 of FIG. 11C, the semiconductor device manufactured based on the processes illustrated in FIGS. 10A and 10B is a trench gate transistor comprising a p-doped body region 450, a $p^+$-doped body contact region 451 and an $n^+$-doped source region 452. A gate dielectric 453 in a trench 456 electrically isolates a gate electrode 454 from the drift or base zone 426. The gate electrode 454 is electrically connected to the control terminal contact C. In some embodiments, the gate electrode 454 corresponds to the control terminal contact C. The first load terminal contact L1, for example a source terminal contact is electrically connected to the p-doped body region 450 and to the n+-doped source region 452. The highly doped region 438, for example a $p^+$-doped bipolar injection region of an IGBT or an n+-doped drain contact region of an IGFET at the second surface 405 is electrically connected to the second load terminal contact L2, for example a collector terminal contact. In addition to the gate dielectric 453 and the gate electrode 454, one or more field dielectric(s) and field electrode(s) may be arranged in the trench 456, for example between the gate electrode 454 and a bottom side of the trench.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing semiconductor wafers, the method comprising:
determining at least one material characteristic for at least two positions of a semiconductor ingot;
forming a notch or a flat in the semiconductor ingot extending along an axial direction;
forming a plurality of markings in a circumference of the semiconductor ingot, wherein at least some of the plurality of markings at different positions along the axial direction are distinguishable from each other by a characteristic feature set depending on the at least one material characteristic; and thereafter
slicing the semiconductor ingot into semiconductor wafers.

2. The method of claim 1, wherein the at least some of the plurality of markings at different positions along the axial direction are distinguishable from each other by an angular position relative to the notch or flat.

3. The method of claim 1, wherein the at least some of the plurality of markings at different positions along the axial direction are distinguishable from each other by marking shape.

4. The method of claim 1, wherein the at least some of the plurality of markings at different positions along the axial direction are distinguishable from each other by a radial extension toward a center of the semiconductor ingot.

5. The method of claim 1, wherein the at least some of the plurality of markings at different positions along the axial direction are distinguishable from each other by an angular extension.

6. The method of claim 5, wherein the at least some of the plurality of markings at different positions along the axial direction are positioned at a same angular position.

7. The method of claim 1, wherein the plurality of markings are formed by at least one of laser marking and machining.

8. The method of claim 1, wherein the notch or flat and the plurality of markings are formed in a same process equipment.

9. The method of claim 1, wherein the plurality of markings are formed in the semiconductor ingot by rotating the semiconductor ingot between 0° and 360° around the axial direction while moving a marking position along the axial direction from a first axial position to a second axial position, thereby increasing an angular distance of the markings with increasing distance from the first axial position.

10. The method of claim 9, wherein the marking position is moved along the axial direction by moving the semiconductor ingot relative to a marking process equipment or by moving the marking process equipment relative to the silicon ingot.

11. The method of claim 1, wherein the semiconductor ingot is rotated between 0° and 180° around the axial direction while moving the marking position along the axial direction.

12. The method of claim 1, wherein at least two of the plurality of markings are formed at different angular positions with respect to at least one axial position.

13. The method of claim 1, wherein the at least one material characteristic is one or more of a resistivity, an oxygen concentration and a carbon concentration level.

14. The method of claim 1, wherein the at least one material characteristic is determined at opposite ends of the semiconductor ingot.

15. The method of claim 1, wherein the at least one material characteristic is determined at the circumference of the semiconductor ingot.

16. A method of manufacturing a semiconductor device, the method comprising:
determining a material characteristic of a semiconductor wafer by analyzing a marking at a circumference of the semiconductor wafer, the marking being different from a flat;

adjusting at least one of proton irradiation and annealing parameters based on the material characteristic;
irradiating the semiconductor wafer with protons; and thereafter
annealing the semiconductor wafer based on the at least one of the adjusted proton irradiation and annealing parameters.

17. The method of claim 16, wherein the marking is analyzed by measuring one or more of an angular position of the marking relative to a flat, a shape of the marking, a radial extension toward a center of the semiconductor wafer, and an angular extension of the marking.

18. The method of claim 16, wherein the semiconductor wafer is annealed at a temperature range of 350° C. to 550° C. for a duration between 30 minutes and 10 hours.

19. The method of claim 16, wherein the semiconductor wafer is irradiated with the protons at an implantation dose range of $1\times10^{13}$ cm$^{-2}$ to $4\times10^{14}$ cm$^2$.

20. The method of claim 16, further comprising, after proton irradiation and annealing, forming semiconductor device elements in the semiconductor wafer.

21. The method of claim 16, wherein the semiconductor wafer is irradiated with the protons at an implantation energy range of 200 keV to 6 MeV.

22. The method of claim 16, wherein the semiconductor wafer is irradiated with the protons at an implantation energy range of 1.5 MeV to 5.5 MeV, thereby forming a drift zone.

23. The method of claim 16, wherein the semiconductor wafer is irradiated with the protons at an implantation energy range of 200 keV to 2 MeV, thereby forming a field stop zone.

* * * * *